(12) United States Patent
Azuma et al.

(10) Patent No.: US 6,765,980 B2
(45) Date of Patent: Jul. 20, 2004

(54) SHIFT REGISTER

(75) Inventors: Toshiki Azuma, Ibaraki (JP); Manabu Nishimuzu, Oita (JP); Atsuhiro Miwata, Oita (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/255,821

(22) Filed: Sep. 25, 2002

(65) Prior Publication Data

US 2003/0076918 A1 Apr. 24, 2003

(30) Foreign Application Priority Data

Oct. 1, 2001 (JP) ........................................ 2001-305653

(51) Int. Cl.[7] ............................................. G11C 19/00
(52) U.S. Cl. ............................. 377/69; 377/78; 377/79; 377/81; 345/98; 345/99; 345/100
(58) Field of Search ...................... 345/98–100; 377/69, 377/78, 79, 81

(56) References Cited

U.S. PATENT DOCUMENTS 6,529,180 B1 * 3/2003 Ito et al. ........................ 345/89

* cited by examiner

Primary Examiner—Margaret Wambach
(74) Attorney, Agent, or Firm—William B. Kempler; W. James Brady, III; Frederick J. Telecky, Jr.

(57) ABSTRACT

A shift register with low power consumption has memory circuits $15_1$-$15_N$ connected in series, gate circuits in memory circuits $15_{2n-1}$ in the odd-numbered locations become conductive when clock signal CK is high, and gate circuits in memory circuits $15_{2n}$ in the even-numbered locations become conductive when clock signal CK is low, wherein data signals S input are latched for output when the gate circuits are shut off. The circuit configuration is simplified. The Shift register operates every one half of the cycle of clock signal CK, allowing the frequency of clock signal to be reduced by half, resulting in reduced power consumption.

4 Claims, 7 Drawing Sheets

SHIFT REGISTER

FIELD OF THE INVENTION

The present invention pertains to a shift register; in particular, to a bidirectional shift register.

BACKGROUND OF THE INVENTION

Conventionally, a gate driver utilizing a shift register has been utilized for a panel display device utilizing liquid crystal and plasma.

Symbol 200 in FIG. 8 indicates a panel type display device provided with panel 211, multiple pixels 210 formed on panel 211, gate driver 102, and source driver 202.

Multiple (N, in this case) gate lines $221_1$-$221_N$ and multiple (M, in this case) source lines $221_1$-$222_M$ are connected to gate driver 102 and source driver 202, respectively.

Pixels 210 are arranged in the form of a matrix, and a transistor is provided in each pixel 210. In the transistor in 1 pixel 210, a gate terminal and a source terminal are connected to gate line $221_x$ and source line $222_m$ corresponding to its position (n,m) in the matrix.

Drain terminal of the transistor in each pixel is connected to an electrode used to apply a voltage to a displaying member, such as a liquid crystal or a light-emitting element, wherein the displaying member in pixel 210 becomes bright or dark as the transistor in pixel 210 becomes conductive according to the voltage applied to the source terminal of said transistor.

In said display device 200, gate driver 102 supplies a signal to the respective gate lines in order to make the transistors in the respective pixels conductive in a time-divided manner.

The order the signal is supplied can be either in the forward direction, that is, from first gate line $221_1$ toward the Nth gate line $221_N$, or in the backward direction. When the signal is supplied from gate driver 102 to gate line $221_n$, the signal which makes the transistors conductive is applied at once to the gate terminals of M pixels $210_{n,1}$-$210_{n,M}$ connected to said gate line $221_n$, and the electrical connection is achieved between the drain terminals and the source terminals of M pixels $210_{n,1}$-$210_{n,M}$ connected to said gate line $221_n$.

When the signal is applied to gate line $221_n$, source driver 202 applies a voltage corresponding to the display condition of M pixels $210_{n,1}$-$210_{n,M}$ connected to said gate line $221_n$.

Therefore, M pixels $210_{n,1}$-$210_{n,M}$ connected to gate line $221_n$ become bright or dark according to the level of the voltage supplied by source driver 202.

When the display of 1 gate line $221_n$ is finished, a voltage is supplied to next gate line $221_{n+1}$ using the same procedure.

One screen is displayed as the first through the Nth gate lines $221_1$-$221_N$ are scanned in said manner.

A block diagram of a conventional internal circuit of such a gate driver 102 is shown in FIG. 6.

Said gate driver 102 has input level conversion circuit 112, shift register 105, and output level conversion circuit 106.

Output level conversion circuit 106 has multiple (N, in this case), that is, the first through the Nth, buffer circuits $116_1$-$116_N$ according to the quantity N of gate lines $221_1$-$221_N$, wherein the output terminals of buffer circuits $116_1$-$116_N$ are respectively connected to gate lines $221_1$-$221_N$.

Shift register 105 has multiple (N, in this case), that is, the first through the Nth, memory circuits $115_1$-$115_N$ according to the quantity of buffer circuits $116_1$-$116_N$, wherein the output terminals of memory circuits $115_1$-$115_N$ are respectively connected to the input terminals of buffer circuits $116_1$-$116_N$. Signals output from respective memory circuits $115_1$-$115_N$ are applied with voltage conversion and supplied to gate lines $221_1$-$221_N$ by buffer circuits $116_1$-$116_N$.

Because respective memory circuits $115_1$-$115_N$ of said gate driver 102 have the same configuration, the detailed internal circuit of nth memory circuit $115_n$ is shown in FIG. 7 to represent them.

Each memory circuit $115_1$-$115_N$ has forward transmission input terminal F, backward transmission input terminal B, and output terminal SR.

When the forward transmission input terminal and the backward transmission input terminal of nth memory circuit $115_n$ are expressed as $F_n$ and $B_n$ with the suffix n, and the output terminal is expressed as $SR_n$, output terminal $SR_{n-1}$ of (n−1)th memory circuit $115_{n-1}$ of the former stage is connected to forward transmission input terminal $F_n$ of nth memory circuit $115_n$, output terminal $SR_{n+1}$ of (n+1)th memory circuit $115_{n+1}$ of the latter stage is connected to backward transmission input terminal $B_n$, to which signals output from memory circuits $115_{n-1}$ and $115_{n+1}$ of the former and the latter stages are respectively input.

Then, output terminal $SR_n$ of nth memory circuit $115_n$ is connected to forward input terminal $F_{n+1}$ of memory circuit $115_{n+1}$ of the latter stage and backward transmission input terminal $B_{n-1}$ of memory circuit $115_{n-1}$ of the former stage.

Selection circuit 117, first and second gate circuits 124 and 125, and first and second latch circuits 118 and 119 are provided inside of respective memory circuits $115_1$-$115_N$.

Selection circuit 117 is connected to forward transmission input terminal $F_n$ and backward transmission input terminal $B_n$. In addition, selection signal LR and inverted selection signal XLR with the opposite polarity are input to selection circuit 117 from input level conversion circuit 112, whereby either forward transmission input terminal $F_n$ or backward transmission input terminal $B_n$ is selected, depending on the logical combination of highs and lows of selection signal LR and inverted selection signal XLR, and the selected input terminal gets connected to first gate circuit 124 of the latter stage via inverter 123.

Clock signal CK and inverted clock signal XCK with the opposite polarity are input to first and second gate circuits 124 and 125. First gate circuit 124 is shut off when clock signal CK is high and becomes conductive as it changes from high to low in order to transmit the signal to first latch circuit 118 of the latter stage.

First latch circuit 118 holds the signal input and outputs said signal to second latch circuit 119 of the latter stage via second gate circuit 125.

Second gate circuit 125 becomes conductive when clock signal CK is high, and it is shut off while first gate circuit 124 is conductive.

Therefore, as soon as clock signal CK changes from low to high, and first gate circuit 124 changes from the conductive state to the shut-off state, second gate circuit 125 becomes conductive, and the output of first latch circuit 118 is input to second latch circuit 119. As a result of said operation, a signal with the same logic as that of the high or the low signal held in first latch circuit 118 gets held in second latch circuit 119. The signal held in second latch circuit 119 is output from output terminal $SR_n$.

When clock signal CK changes from high to low as described above, the signal input from forward transmission input terminal $F_n$ or backward transmission input terminal $B_n$ is latched into first latch circuit 118. Then, when clock signal CK changes from low to high, the signal latched into first latch circuit 118 is transferred to second latch circuit 119 for output.

Therefore, when forward transmission input terminal $F_n$ is selected, the signals stored in respective memory circuits $115_1$-$115_{N-1}$ are transmitted to memory circuits $115_2$-$115_N$ of the latter stage as 1 cycle of clock signal CK is completed. When the backward transmission input terminal is selected, the signals stored in respective memory circuits $115_2$-$115_N$ are transmitted to memory circuits $115_1$-$115_{N-1}$ of the former stage as 1 cycle of clock signal CK is completed.

FIG. 9 is a timing chart for explaining the signal transmitting condition when forward transmission input terminal $F_n$ is selected, wherein symbol $t_0$ indicates the time high pulse signal STV is input into memory circuit $115_1$ of the initial stage.

At said time $t_0$, clock signal CK, which has changed from high to low, is input to memory circuit $115_1$ of the initial stage along with pulse signal STV, first gate circuit 124 in memory circuit $115_1$ of the initial stage becomes conductive due to said clock signal CK, and the same high signal as pulse signal STV gets held by first latch circuit 118.

Next, when clock signal CK changes from low to high at time $t_1$, second gate circuit 125 becomes conductive, and the high signal held in first latch circuit 118 is transferred to second latch circuit 119 and output to buffer circuit $116_1$ of the initial stage and memory circuit $115_2$ of the next stage from output terminal $SR_1$.

At memory circuit $115_2$ of the next stage, the high signal is output from output terminal $SR_2$ at time $t_2$ as 1 cycle of clock signal CK is completed after time $t_1$.

High signal is output from output terminal $SR_n$ of nth memory circuit $115_n$ at time $t_n$ in the manner described above.

Although shift register 105 of the prior art has the aforementioned configuration, as the display device becomes much smaller but more precise, the gate driver is provided with more pins, so that the number of the elements in the circuit ends up increasing.

In addition, because the power consumption increases as the number of circuits increases, this problem must be solved before it can be used in portable equipment.

The present invention was created in order to solve the aforementioned inconvenience of the prior art, and its purpose is to present a shift register by which a low-power-consumption gate circuit can be configured.

SUMMARY OF INVENTION

In accordance with one aspect of the present invention the shift register is provided with a first memory circuit having a first selection circuit which outputs a signal to be input to a first input terminal or a second input terminal selectively according to a selection signal, a first gate circuit which outputs the signal output from the aforementioned first selection circuit selectively according to a first clock signal, and a first latch circuit which holds the signal output from the aforementioned first gate circuit and outputs the signal to a first output terminal and a second memory circuit having a second selection circuit which outputs a signal to be input to a third input terminal or a fourth input terminal connected the aforementioned first output terminal selectively according to the aforementioned selection signal, a second gate circuit which outputs the signal output from the aforementioned second selection circuit selectively according to a second clock signal complementary to the aforementioned first clock signal, and a second latch circuit which holds the signal output from the aforementioned second gate circuit and outputs the signal to a second output terminal; and memory circuits having the same configurations as those of the aforementioned first and second memory circuits are connected alternately in series.

In addition, in accordance with a second aspect of the present invention, it is desirable that the aforementioned first memory circuit has a first logic circuit which applies a logical operation to the signal output from the aforementioned first latch circuit and the aforementioned first clock signal and outputs the resulting logical operation signal to a third output terminal, and the aforementioned second memory circuit has a second logic circuit which applies a logical operation to the signal output from the aforementioned second latch circuit and the aforementioned second clock signal and outputs the resulting logical operation signal to a fourth output terminal.

Furthermore, in accordance with another aspect of the invention, it is desirable that the aforementioned first input terminal is connected to the second output terminal of the memory circuit of the former stage, the aforementioned first output terminal is connected to the fourth input terminal of the memory circuit of the former stage, the aforementioned fourth input terminal is connected to the first output terminal of the memory circuit of the latter stage, and the aforementioned second output terminal is connected to the aforementioned second input terminal and the first input terminal of the memory circuit of the latter stage.

One aspect of the present invention is configured in the aforementioned manner, wherein when the data signals are output from the output terminals of the memory circuits in the odd-numbered locations as the gate circuits of the memory circuits in the odd-numbered locations become conductive, the gate circuits of the memory circuits in the even-numbered locations are shut off. Next, when the gate circuits of the memory circuits in the odd-numbered locations are shut off, the gate circuits of the memory circuits in the even-numbered locations become conductive, and the data signals output from the memory circuits in the odd-numbered locations are input to the latch circuits of the memory circuits in the even-numbered locations.

As described above, the gate circuits of the memory circuits in the odd-numbered locations and the gate circuits of the memory circuits in the even-numbered locations operate complementary to each other, and the respective memory circuits output the data signals input from the memory circuits of the former stage to the memory circuits of the latter stage according to the (first or second) clock signal.

In addition, in a further aspect of the present invention, the direction the data signals are shifted can be reversed by changing the logic of the selection signal input to the selection circuit of each memory circuit.

REFERENCE NUMERALS AND SYMBOLS AS SHOWN IN THE DRAWINGS

In the figures, 5 represents a shift register, $15_1$-$15_N$ a memory circuit, 18, 19 is a latch circuit, 24 is a gate circuit, $SR_1$-$SR_N$ is a transmission terminal, $XSR_1$-$XSR_N$ is an output terminal, CK is a clock signal

DESCRIPTION OF THE EMBODIMENT

An embodiment of the present invention will be explained with reference to the figures. In the explanation, alphabetical suffixes, such as N, m, and n, each represents an integer equal to 1 or greater.

Figure 1:
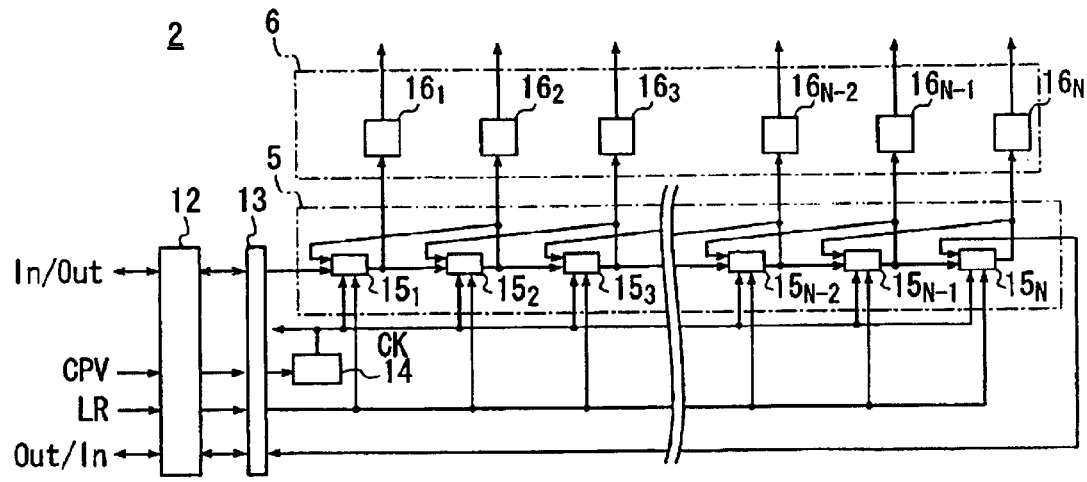
FIG. 1 is an example gate driver utilizing the shift register of the present invention.
Figure 8:
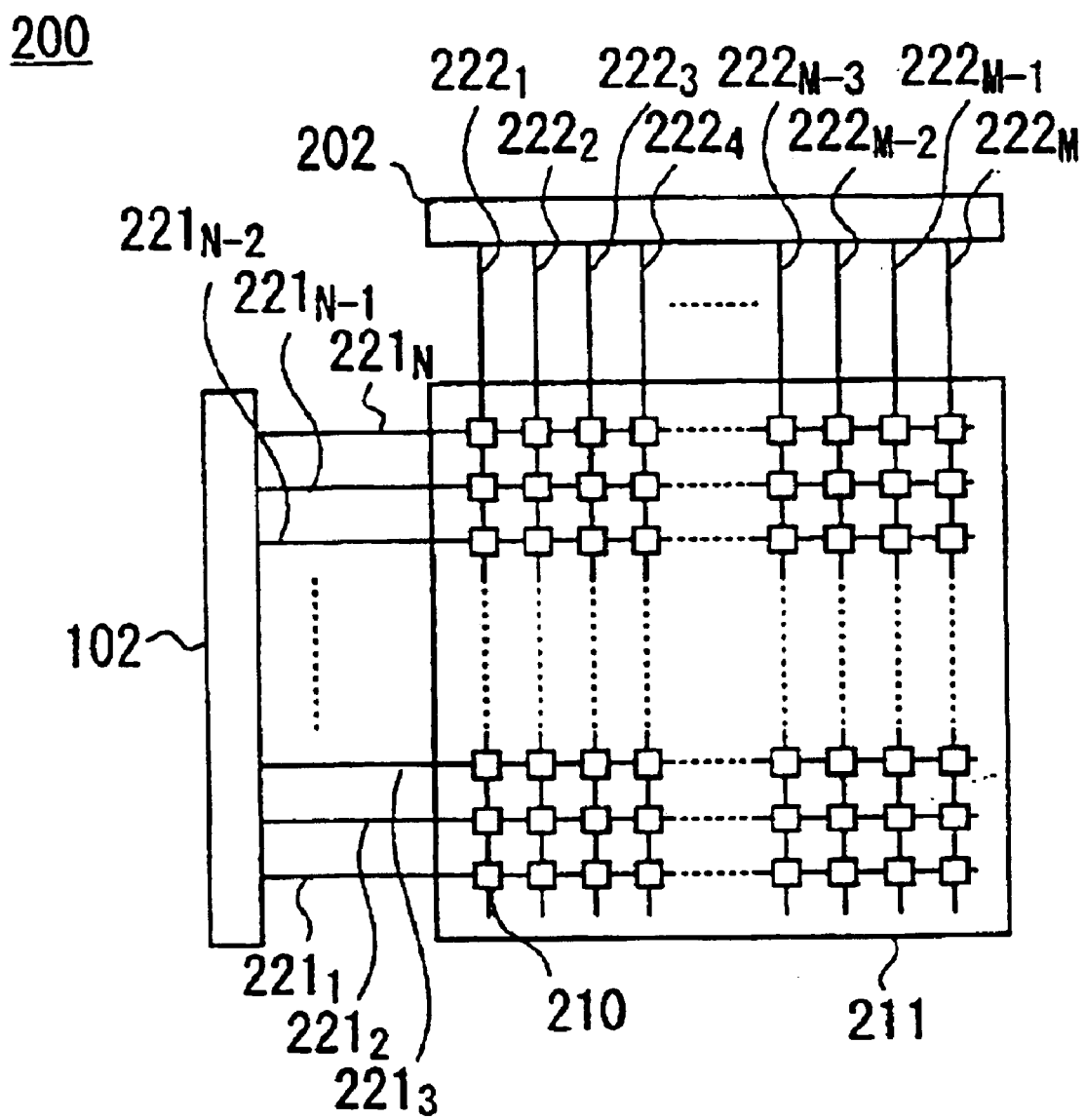
FIG. 8 is a diagram for explaining the display device.
Figure 9:
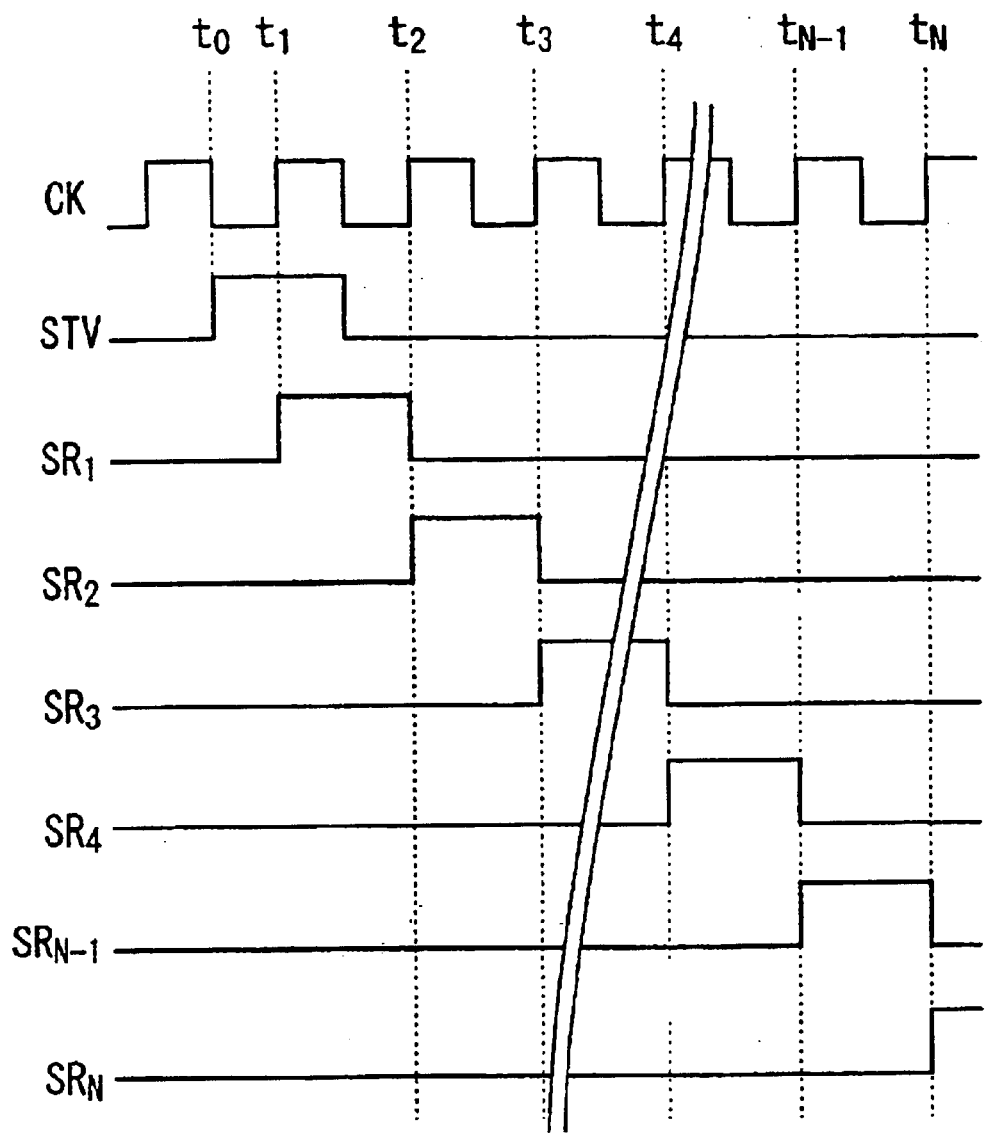
FIG. 9 is a timing chart for explaining the operation of the conventional shift register.

Symbol 2 in FIG. 1 indicates an example gate driver of the present invention. Said gate driver 2 can be used to replace gate driver 102 of the prior art in display device 200 in FIG. 8.

Said gate driver 2 has input circuit 12, control circuit 13, shift register 5, and output circuit 6.

Output circuit 6 has multiple buffer circuits $16_1$-$16_N$ in the same number (N, in this case) as that of gate lines $221_1$-$221_N$.

Output terminals of buffer circuits $16_1$-$16_N$ are connected to gate lines $221_1$-$221_N$, respectively.

Memory circuits $15_1$-$15_N$ are provided in shift register 5 in the same number as that of buffer circuits $16_1$-$16_N$.

Output terminals of memory circuits $15_1$-$15_N$ are connected to the input terminals of buffer circuits $16_1$-$16_N$, respectively, whereby the voltage signals output from each of the respective memory circuits $15_1$-$15_N$ are converted by buffer circuits $16_1$-$16_N$ and supplied to gate lines $221_1$-$221_N$.

In gate driver 2 of the present embodiment, of the first through the Nth memory circuits $15_1$-$15_N$, memory circuits $15_{2n-1}$ in the odd-numbered locations have the same configuration, and memory circuits $15_{2n}$ in the even-numbered locations have the same configuration, but the configurations of memory circuits $15_{2n-1}$ in the odd-numbered locations are different from memory circuits $15_{2n}$ in the even-numbered locations.

Figure 2:
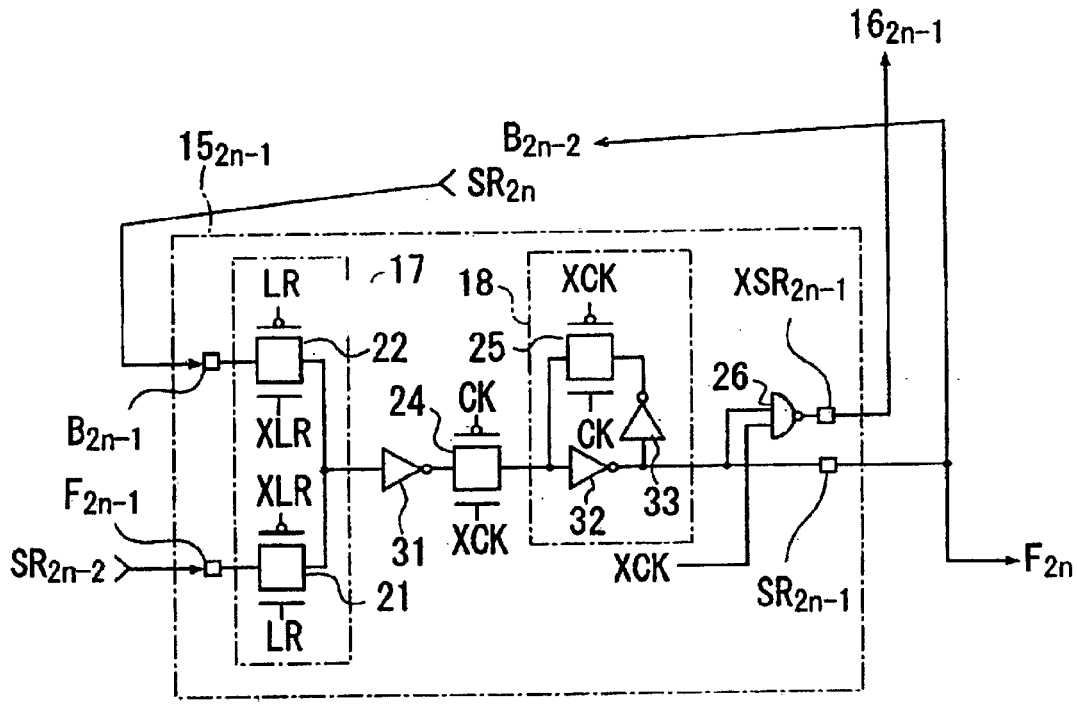
FIG. 2 is an example internal configuration of the memory circuit in an odd-numbered location of the shift register of the present invention.
Figure 3:
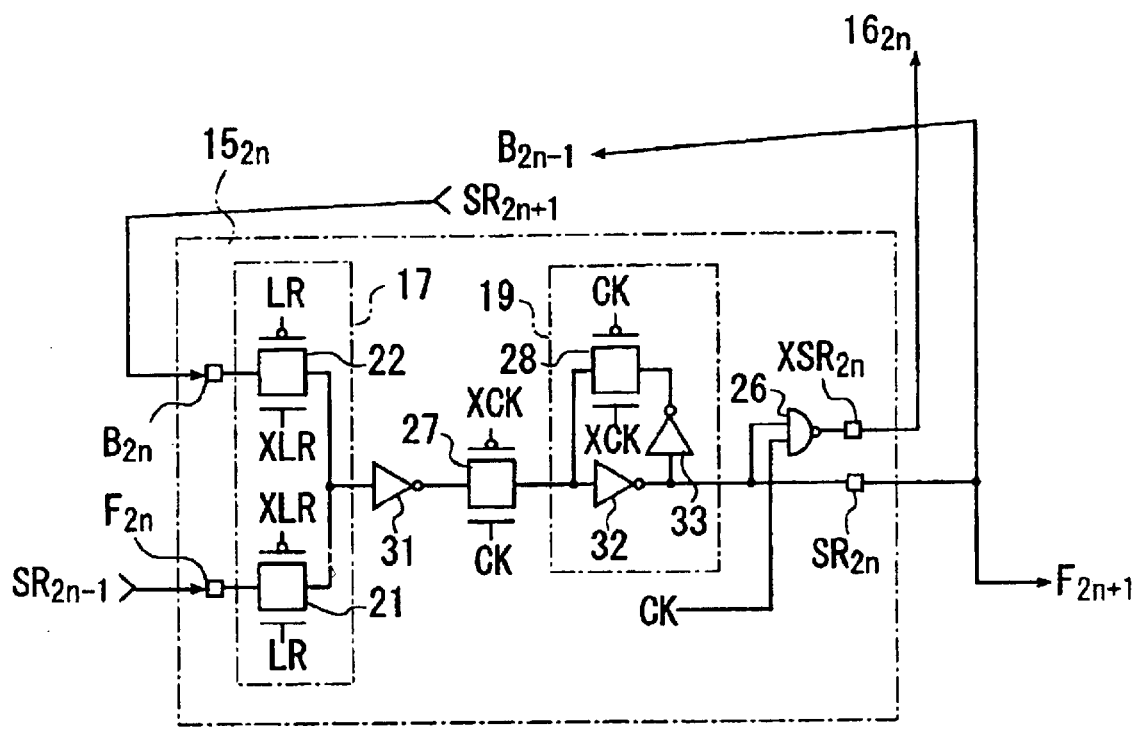
FIG. 3 is an example internal configuration of the memory circuit in an even-numbered location of the shift register of the present invention.

Internal circuit of memory circuit $15_{2n-1}$ in an odd-numbered location is shown in FIG. 2, and internal circuit of memory circuit $15_{2n}$ in an even-numbered location is shown in FIG. 3.

Selection signal LR for deciding the direction of signal transmission, inverted selection signal XLR, clock signal CK, and inverted clock signal XCK are input to memory circuit $15_{2n-1}$ in the odd-numbered location and memory circuit $15_{2n}$ in the even-numbered location. Inverted selection signal XLR is a signal having the opposite polarity to that of selection signal LR, and inverted clock signal XCK is a signal having the opposite polarity to that of the clock signal.

First, memory circuit $15_{2n-1}$ will be explained. Memory circuit $15_{2n-1}$ in an odd-numbered location has forward input terminal $F_{2n-1}$, backward input terminal $B_{2n-1}$, transmission terminal $SR_{2n-1}$, external output terminal $XSR_{2n-1}$, selection circuit 17, gate circuit 24, and latch circuit 18.

First switch 21, which becomes conductive when selection signal LR is high and inverted selection signal XLR is low, and second switch 22, which becomes conductive when selection signal LR is low and inverted selection signal XLR is high, are provided in selection circuit 17.

Forward input terminal $F_{2n-1}$ and backward input terminal $B_{2n-1}$ are connected to the input terminal of first inverter 31 via first and second switches 21 and 22, respectively.

Therefore, when selection signal LR is high and inverted selection signal XLR is low, forward input terminal $F_{2n-1}$ gets connected to the input terminal of first inverter 31. On the contrary, when selection signal LR is low and inverted selection signal XLR is high, backward input terminal $B_{2n-1}$ gets connected to the input terminal of first inverter 31.

Output terminal of first inverter 31 is connected to latch circuit 18 via gate circuit 24. Clock signal CK and inverted clock signal XCK are input to said gate circuit 24 and gate circuit 27 of memory circuit $15_{2n}$ in an even-numbered location to be described later, and the conductive state and the shut-off state are decided according to the logical combination of highs and lows of clock signal CK and inverted clock signal XCK.

Here, gate circuit 24 of memory circuit $15_{2n-1}$ in an odd-numbered location is a low-active switch which becomes conductive when clock signal CK is low (inverted clock signal XCK is high at that time). As such, when low-active gate circuit 24 is conductive, output terminal of first inverter 31 is connected to latch circuit 18. Under said condition, the signal input to first inverter 31 is inverted and transmitted to latch circuit 18.

Latch circuit 18 has second and third inverters 32 and 33 and switch 25. The signal input to latch circuit 18 is inverted by second inverter 32 and output from transmission terminal $SR_{2n-1}$. Therefore, the logic of the signal input to first inverter 31 is inverted by first and second inverters 31 and 32, and the signal with the original logic is output from transmission terminal $SR_{2n-1}$.

Output terminal of second inverter 32 is connected to the input terminal of second inverter 32 via third inverter 33 and switch 25.

Said switch 25 is a high-active switch which becomes conductive when low-active gate circuit 24 is shut off, that is, when clock signal CK is high. As such, high-active switch 25 becomes conductive as low-active gate circuit 24 changes from the conductive state to the shut-off state. As a result, the signal output from second inverter 32 gets inverted by third inverter 33 and fed back to the input terminal of second inverter 32.

This indicates the condition in which latch circuit 18 is in latching state, wherein output of second inverter 32 is stable under the same condition as that attained when low-active gate circuit 24 is conductive, and the latched signal is continuously output from transmission terminal $SR_{2n-1}$.

To the contrary, because the latching state is cancelled as high-active switch 25 changes from the conductive state to the shut-off state when low-active gate circuit 24 changes from the shut-off state to the conductive state, the signal output from second inverter 32 is no longer fed back to the input terminal.

At this time, because the signal output from first inverter 31 is input to latch circuit 18, the content held in latch circuit 18 is lost, and the signal input to latch circuit 18 is inverted by second inverter 32 and output from transmission terminal $SR_{2n-1}$.

Memory circuit $15_{2n-1}$ in an odd-numbered location is configured in the aforementioned manner, wherein either forward input terminal $F_{2n-1}$ or backward input terminal $B_{2n-1}$ gets connected to transmission terminal $SR_{2n-1}$ as clock signal CK changes from high to low, and the signal input to forward input terminal $F_{2n-1}$ or backward input terminal $B_{2n-1}$ is output from transmission terminal $SR_{2n-1}$.

Then, forward input terminal $F_{2n-1}$ and backward input terminal $B_{2n-1}$ are cut off from transmission terminal $SR_{2n-1}$ as clock signal CK changes from said state to high, and latch circuit 18 enters the latching state, so that the signal prior to clock signal's CK turning to high is held in latch circuit 18 and output from transmission terminal $SR_{2n-1}$ continuously.

The latching state continues until clock signal CK changes from high to low again.

As explained above, in the case of memory circuit $15_{2n-1}$ in an odd-numbered location, the signal input to forward input terminal $F_{2n-1}$ or backward input terminal $B_{2n-1}$ is output from transmission terminal $SR_{2n-1}$ at the time clock signal CK turns from high to low.

Next, memory circuit $15_{2n}$ in an even-numbered location will be explained using FIG. 3. Memory circuit $15_{2n}$ in an even-numbered location has forward input terminal $F_{2n}$, backward input terminal $B_{2n}$, transmission terminal $SR_{2n}$, external output terminal $XSR_{2n}$, selection circuit 17, gate circuit 27, and latch circuit 19.

Selection circuit 17 of memory circuit $15_{2n}$ in an even-numbered location has the same configuration as that of memory circuit $15_{2n-1}$ in an odd-numbered location, wherein first and second switches 21 and 22 connect forward input terminal $F_{2n-2}$ to the input terminal of first inverter 31 when selection signal LR is high and inverted selection signal XLR is low, and backward input terminal $B_{2n}$ to the input terminal of first inverter 31 when selection signal LR is low and inverted selection signal XLR is high.

Output terminal of first inverter 31 is connected to latch circuit 19 via gate circuit 27.

Although gate circuit 24 was low-active in memory circuit $15_{2n-1}$ in an odd-numbered location, it is high-active in the case of memory circuit $15_{2n}$ in an even-numbered location. That is, gate circuit 27 becomes conductive as clock signal CK changes from low to high, and the signal output from first inverter 31 is transmitted to latch circuit 19.

Second and third inverters 32 and 33 and switch 28 are provided in latch circuit 19. The signal input to latch circuit 19 is inverted by second inverter 32 and output from transmission terminal $SR_{2n}$.

In memory circuit $15_{2n}$ in an even-numbered location, switch 28 in latch circuit 19 is low-active, so that the signal output from second inverter 32 is inverted by third inverter 33 when said switch 24 is conductive and fed back to the input terminal of second inverter 32. At this time, latch circuit 19 enters the latching state.

Because high-active gate circuit 27 is shut off when clock signal CK is low, that is, while in the latching state, the signal prior to the shutting off of said gate circuit 27 is held in latch circuit 19. Then, the latching state of latch circuit 19 is cancelled as clock signal changes from low to high, either forward input terminal $F_{2n}$ or backward input terminal $B_{2n}$ gets connected to transmission terminal $SR_{2n}$, and the signal input to forward input terminal $F_{2n}$ or backward input terminal $B_{2n}$ is output to transmission terminal $SR_{2n}$.

As explained above, contrary to memory circuit $15_{2n-1}$ in an odd-numbered location, in the case of memory circuit $15_{2n}$ in an even-numbered location, the signal input to forward input terminal $F_{2n}$ or backward input terminal $B_{2n}$ is output from transmission terminal $SR_{2n}$ at the time clock signal CK changes from low to high.

That is, the signal input to memory circuit $15_{2n-1}$ in an odd-numbered location is output to memory circuit $15_{2n}$ in an even-numbered location from transmission terminal $SR_{2n-1}$ during 1 cycle of clock signal CK (period between the beginning of high to the end of low of clock signal CK).

Here, when selection signal LR is high, inverted selection signal XLR is low, and forward input terminals $F_1$-$F_N$ are selected by selection circuits 17 of respective memory circuits $15_1$-$15_N$, the signals output from transmission terminals $SR_1$-$SR_{N-1}$ of respective memory circuits $15_1$-$15_{N-1}$ are input to memory circuits $15_2$-$15_N$ of the latter stage.

Figure 4:
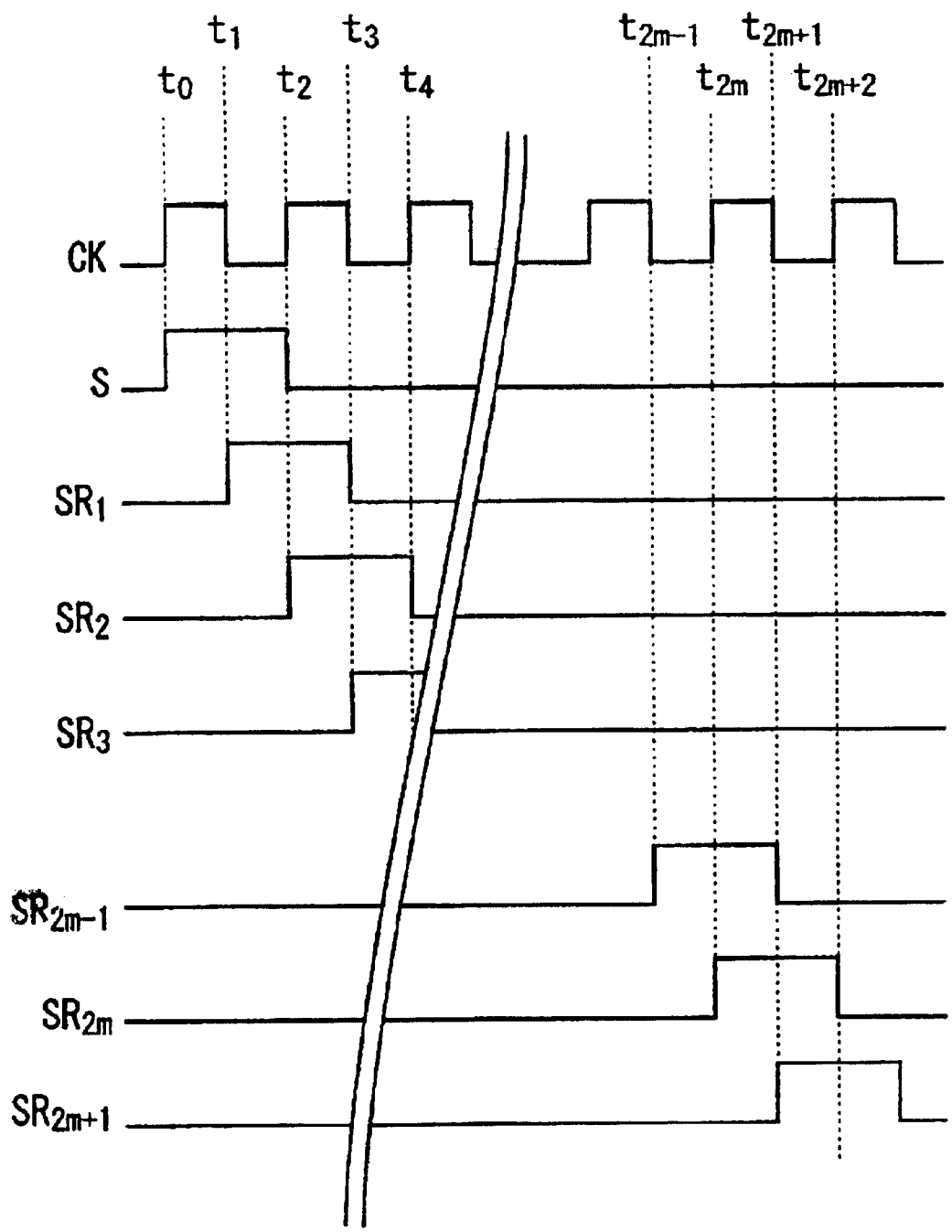
FIG. 4 is a timing chart (1) for explaining the operation of the memory circuit.

FIG. 4 is a timing chart showing the output condition of transmission terminals $SR_1$-$SR_N$ when forward input terminals $F_1$-$F_N$ are selected, wherein data signal S comprising a high-level pulse is input to input terminal $F_1$ of the initial stage at initial time $t_0$ at which clock signal CK rises from low to high. Data signal S is input during a period equivalent to 1 cycle of clock signal CK.

Here, at time $t_0$, gate circuit 24 in the initial memory circuit $15_1$ is shut off, and output of transmission terminal $SR_1$ is maintained at the low level. As clock signal CK changes from high to low at time $t_1$, gate circuit 24 in the initial memory circuit $15_1$ becomes conductive, and data signal S is output from transmission terminal $SR_1$.

Although said data signal S is input to second memory circuit $15_2$ of the next stage at time $t_1$, because gate circuit 27 is shut off, said input signal is not output, and data signal S is output from second transmission terminal $SR_2$ at time $t_2$ at which clock signal changes from low to high.

At said time $t_2$, latch circuit 18 in memory circuit $15_1$ of the initial stage begins operating to hold data signal S, and data signal S is continuously output from transmission terminal $SR_1$ of the initial stage after time $t_2$.

Next, when clock signal CK changes from high to low, the latching state in memory circuit $15_1$ of the initial stage is cancelled, and the output of data signal S from transmission terminal $SR_1$ of the initial stage is ended.

At said time $t_3$, data signal S is output from transmission terminal $SR_2$ of second memory circuit $15_2$, gate circuit 24 in third memory circuit $15_3$ becomes conductive at time $t_3$, and data signal S is output from third transmission terminal $SR_3$. In addition, second memory circuit $15_2$ enters the latching state at time $t_3$.

As described above, in the case of shift register 5 of the present invention, because data signals S are transmitted from transmission terminals $SR_1$-$SR_N$ of respective memory circuits $15_1$-$15_{N-1}$ to memory circuits $15_2$-$15_N$ of the latter stage every one half of the cycle of clock signal CK, it operates at one-half of the cycle of the clock signal of conventional shift register 105.

When backward input terminals $B_1$-$B_N$ are selected, which is contrary to the situation occurring in the forward direction, initial data signal S is input to backward input terminal $B_N$ of the last memory circuit $15_N$, and data signal S is transmitted every one-half of the cycle of clock signal CK toward the memory circuits with larger numbers, that is, $15_{N-1}$, $15_{N-2}$, . . . $15_1$.

As described above, with shift register 5 of the present invention, data signals D are shifted every one-half of the cycle of clock signal.

Symbol 14 in FIG. 1 represents a dividing circuit to be controlled by control circuit 13 in order to divide external clock signal CPV input from another circuit to generate clock signal CK having a ½ frequency of that of external clock signal CPV. Said clock signal CK is supplied to respective memory circuits $15_1$-$15_N$.

Therefore, if the signals output from transmission terminals $SR_1$-$SR_N$ are output to buffer circuits $16_1$-$16_N$ as they are, the signals end up being output during the period equal to 2 cycles of external clock signal CPV.

With level-shifting circuit 5 of the present invention, the signals output from transmission terminals $SR_1$-$SR_N$ are not output to buffer circuits $16_1$-$16_N$.

Respective memory circuits $15_1$-$15_N$ are provided with logic elements 26, each comprising a NAND element and external output terminals $XSR_1$-$XSR_N$, whereby the signals output from latch circuits 18 and 19 are inverted and output to external output terminals $XSR_1$-$XSR_N$ via logic elements 26, and the signals output from external output terminals $XSR_1$-$XSR_N$ are input to respective buffer circuits $16_1$-$16_N$.

Although the signals are output from latch circuits 18 and 19 in synchronization with the rise or fall of clock signal CK only during the period equal to 1 cycle of clock signal CK, logic elements 26 shut off the output to external output terminals $XSR_1$-$XSR_N$ forcibly when one-half of the cycle of clock signal CK has passed after the signals are output from latch circuits 18 and 19.

In the present embodiment, the signals held in latch circuits 18 and 19 are output when clock signal CK is at the high level, the signals output from latch circuit 18 and clock signal CK are input to logic elements 26 at memory circuits $15_{2n-1}$ in odd-numbered locations, and the inverted signals are output to external output terminals $XSR_{2n-1}$ only when clock signal CK is high. In memory circuits $15_{2n}$ in even-numbered locations, the signals output from latch circuit 19 and inverted clock signal XCK are input to logic elements 26, and the inverted signals are output to external output terminals $XSR_{2n}$ only when inverted clock signal XCK is high.

Figure 5:
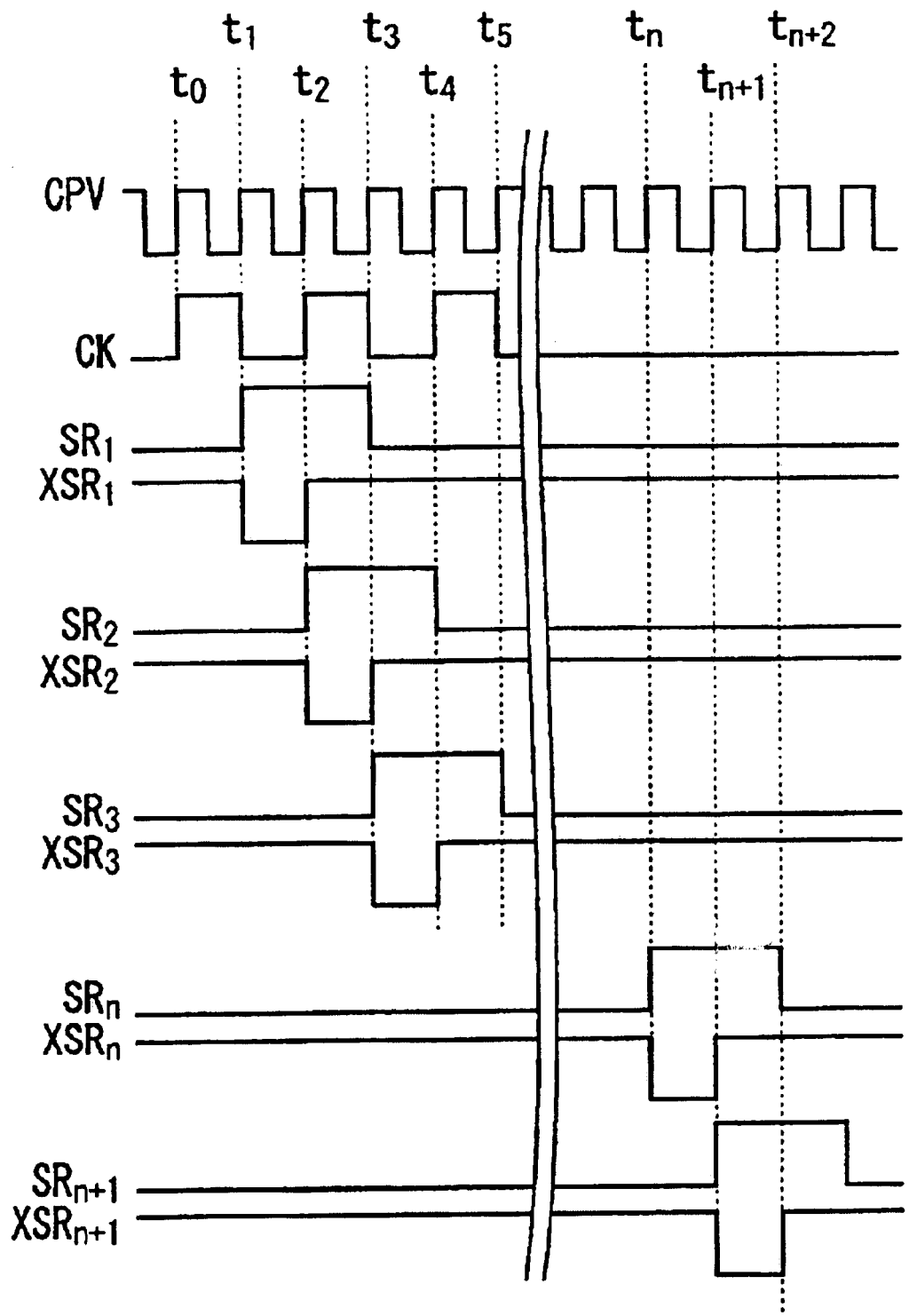
FIG. 5 is a timing chart (2) for explaining the operation of the memory circuit.
Figure 6:
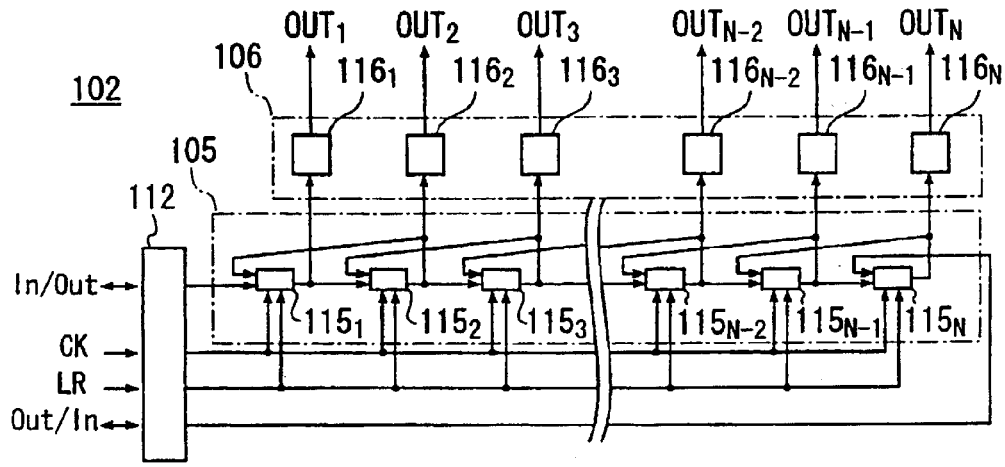
FIG. 6 is an example gate driver utilizing the shift register of the prior art shift register.
Figure 7:
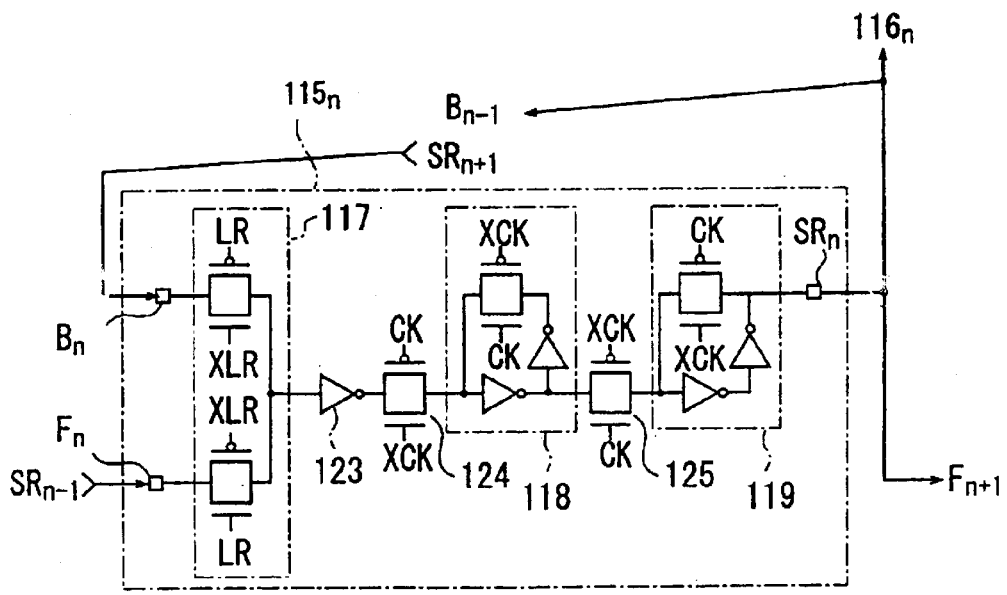
FIG. 7 is an example configuration of the memory circuits in the shift register of FIG. 6.

FIG. 5 is a timing chart showing the timing among transmission terminals $SR_1$-$SR_N$, external output terminals $XSR_1$-$XSR_N$, and clock signal CK. $SR_n$ and $XSR_n$ indicate the transmission terminal and the output terminal in the nth place, respectively.

The low-pulse signal output from external output terminal $XSR_n$ is output in synchronization with the rise time $t_n$ of external clock signal CPV, and the output ends when 1 cycle of external clock signal CPV has passed. The output of transmission terminal $SR_n$ continues during a period equal to 2 cycles of external clock signal CPV.

The signal output from transmission terminal $SR_N$ of the last memory circuit $15_N$ is output to the external circuit via control circuit 13 and input circuit 12.

A case in which the signals latched by latch circuits 18 and 19 are high was explained above. However, the configuration can be changed so as to latch low signals when low signals are to be shifted.

Because a small number of elements are required, space can be saved, and power consumption can be reduced.

Because it operates using a clock signal with ½ frequency, power consumption can be reduced.

What is claimed is:

1. A shift register comprising:
    a first memory circuit having a first and second input terminal and a first selection circuit which generates a first selected signal from a signal input to the first input terminal or the second input terminal selectively according to a selection signal, a first gate circuit which generates a first gate signal from the first selected signal selectively according to a first clock signal, and a first latch circuit which holds the first gate signal and generates a first output signal from the first gate signal to a first output terminal;
    a second memory circuit having a third and a fourth input terminal and a second selection circuit which generates a second selected signal from a signal input to the third input terminal or the fourth input terminal connected to the first output terminal selectively according to the selection signal, a second gate circuit which generates a second gate signal from the second selected signal selectively according to a second clock signal complementary to the first clock signal, and a second latch circuit which holds the second gate signal and generates a second output signal from the second gate signal to a second output terminal, and
    wherein memory circuits having the same configurations as the first and the second memory circuits are connected alternately in series.

2. The shift register described in claim 1 wherein the first memory circuit has a first logic circuit which applies a logical operation to the first output signal and the first clock signal and outputs the resulting logical operation signal to a third output terminal, and
    the second memory circuit has a second logic circuit which applies a logical operation to the second output signal and the second clock signal and outputs the resulting logical operation signal to a fourth output terminal.

3. The shift register described in claim 1 comprising at least 3 stages, each stage corresponding to one of the first or the second memory circuits, wherein in an intermediate stage, one input of the first or second memory circuit is coupled to an output of a preceding stage and another input of the first or second memory circuit is coupled to an output of a following stage, an output of the intermediate stage being coupled to an input of the preceding stage and to an input of the following stage.

4. The shift register described in claim 2 comprising at least 3 stages, each stage corresponding to one of th first or the second memory circuits, wherein in an intermediate stage, one input of the first or second memory circuit is coupled to an output of a preceding stage and another input of the first or second memory circuit is coupled to an output of a following stage, an output of the intermediate stage being coupled to an input of the preceding stage and to an input of the following stage.

* * * * *